(12) United States Patent
Ko

(10) Patent No.: US 8,193,576 B2
(45) Date of Patent: Jun. 5, 2012

(54) SEMICONDUCTOR MEMORY DEVICE AND METHOD OF FABRICATING THE SAME

(75) Inventor: Kwang-Young Ko, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 370 days.

(21) Appl. No.: 12/512,788

(22) Filed: Jul. 30, 2009

(65) Prior Publication Data

US 2010/0025751 A1    Feb. 4, 2010

(30) Foreign Application Priority Data

Jul. 30, 2008    (KR) .................. 10-2008-0074670

(51) Int. Cl.
*H01L 29/788* (2006.01)
*H01L 21/8247* (2006.01)

(52) U.S. Cl. ......... 257/321; 257/E21.681; 257/E29.304; 438/266

(58) Field of Classification Search .................. 257/321, 257/E21.681, E29.304; 438/266
See application file for complete search history.

(56) References Cited

U.S. PATENT DOCUMENTS

| 6,027,974 A * | 2/2000 | Liu et al. ........................ 438/258 |
| 6,555,869 B2 * | 4/2003 | Park .............................. 257/315 |
| 7,301,194 B1 * | 11/2007 | Paak et al. ..................... 257/315 |
| 2007/0164347 A1 * | 7/2007 | Kim .............................. 257/315 |

FOREIGN PATENT DOCUMENTS

KR    10-0688585    2/2007

* cited by examiner

*Primary Examiner* — Steven J Fulk
(74) *Attorney, Agent, or Firm* — Sherr & Vaughn, PLLC

(57) ABSTRACT

A semiconductor memory device and a method of fabricating the same which is suitable for fabrication of a non-volatile memory, such as an EEPROM, using a polysilicon-insulator-polysilicon (PIP) process. The semiconductor memory device includes isolation layers defining a tunneling region and a read transistor region of a semiconductor substrate, a lower polysilicon film formed on and/or over the tunneling region and the read transistor region, a dielectric film formed on and/or over the lower polysilicon film in the tunneling region, and an upper polysilicon film formed on and/or over the dielectric film.

19 Claims, 5 Drawing Sheets

SEMICONDUCTOR MEMORY DEVICE AND METHOD OF FABRICATING THE SAME

The present application claims priority under 35 U.S.C. §119 to Korean Patent Application No. 10-2008-0074670, filed on Jul. 30, 2008, which is hereby incorporated by reference in its entirety.

BACKGROUND

Non-volatile semiconductor memory devices include a single poly EEPROM having a single polysilicon layer functioning as a gate, a stack gate, such as an ETOX, having two vertically stacked polysilicon layers, and a dual poly and a split gate corresponding to intermediates between the single poly EEPROM and the split gate.

Generally, the stack gate-type memory device has the smallest cell size but has a complicated circuit, and thus, is suited for high-density or high-performance applications. On the other hand, the stack gate-type memory device is not suited for low-density applications. The EEPROM is mainly used for low-density applications. For example, the single poly EEPROM is fabricated by adding two mask processes to a logic process.

Figure 1:
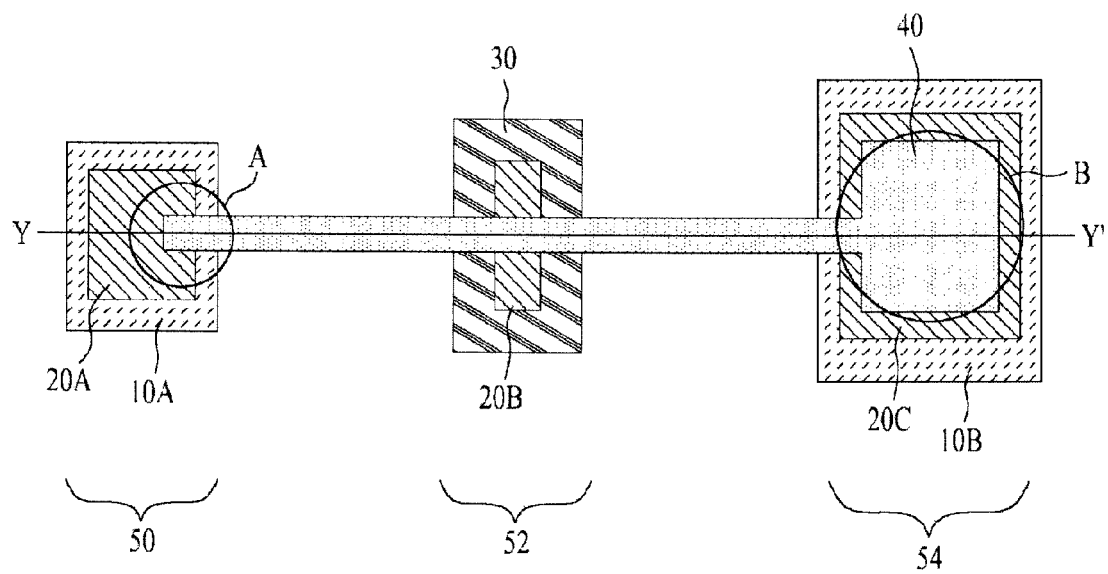
Figure 2:
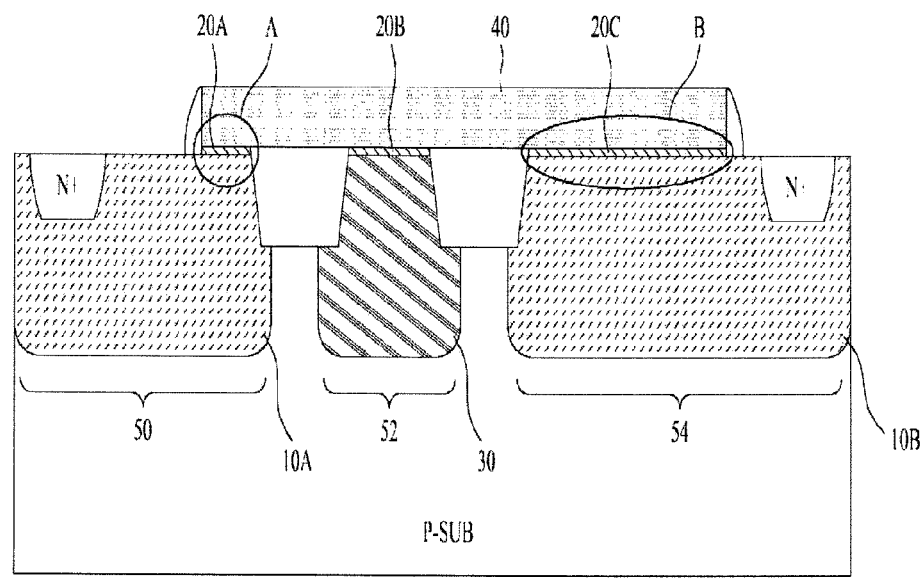

FIG. 1 is a plan view illustrating a single poly EEPROM cell while FIG. 2 is a longitudinal-sectional view taken along the line Y-Y' of the EEPROM cell of FIG. 1.

As illustrated in FIG. 1, a single poly EEPROM cell performs a programming operation and an erasing operation using an FN (Fowler-Nordheim) tunneling method. The single poly EEPROM cell is divided into tunneling region 50 having well 10A and active region 20A, read transistor region 52 having active region 20B and well 30, and control gate region 54 having well 10B and active region 20C. Polysilicon pattern 40 is formed on and/or over tunneling region 50, read transistor region 52 and control gate region 54. If an N-MOS structure is used, well 10A of the tunneling region 50 and well 10B of the control gate region 54 are an N-type, while well 30 of read transistor region 52 is a P-type. In this case, it is necessary to isolate a P-type semiconductor substrate and the EEPROM cell from each other.

Tunneling of electrons in tunneling region 50 is generated using a coupling ratio between capacitance A of tunneling region 50 and capacitance B of control gate region 54, thereby performing programming/erasing operations. In the programming/erasing operations, in order to properly increase the coupling ratio between capacitance A of tunneling region 50 and capacitance B of control gate region 54, the dimensions of control gate region 54 are increased, thereby increasing the dimensions of an area where active region 20C of control gate region 54 and polysilicon pattern 40 overlap with each other. Thereby, the overall size of the cell is increased.

Accordingly, in an EEPROM of several tens of bits or more, the overall size of an EEPROM cell is increased, and thus cell density is lowered. Moreover, in case that a dual poly EEPROM cell is fabricated in order to enhance cell density, a process of forming a separate insulating film for capacitance of a control gate region or a process of manufacturing a separate control gate is required, thereby complicating the fabrication of the dual poly EEPROM cell.

SUMMARY

Embodiments relate to a semiconductor memory device and a method of fabricating the same which is suitable for fabrication of a non-volatile memory, such as an EEPROM, using a polysilicon-insulator-polysilicon (PIP) process.

Embodiments relate to a semiconductor memory device and a method of fabricating the same having a high cell density secured by using a simple process without increasing cell size.

Embodiments relate to a semiconductor memory device and a method of fabricating the same in which a high cell density is secured without the necessity of performing separate processes other than a polysilicon-insulator-polysilicon (PIP) process.

In accordance with embodiments, a semiconductor memory device may include at least one of the following: an isolation layer defining a tunneling region and a read transistor region on and/or over a semiconductor substrate, a lower polysilicon film formed on and/or over the tunneling region and the read transistor region, a dielectric film formed on and/or over the lower polysilicon film in the tunneling region, and an upper polysilicon film formed on and/or over the dielectric film. The lower polysilicon film may function as a floating gate, the dielectric film may function as a capacitor, and the upper polysilicon film may function as a control gate.

In accordance with embodiments, an apparatus may include at least one of the following: a semiconductor substrate, an isolation layer formed in the semiconductor substrate to define a tunneling region and a read transistor region, a lower polysilicon film formed over the semiconductor substrate including the isolation layer in the tunneling region and the read transistor region, a dielectric film formed over a portion of the lower polysilicon film formed in the tunneling region, and an upper polysilicon film formed over the dielectric film.

In accordance with embodiments, an apparatus may include at least one of the following: a semiconductor substrate, a plurality of isolation layers formed in the semiconductor substrate defining a tunneling region and a read transistor region, a first well formed in the tunneling region of the semiconductor substrate, a second well formed spaced apart from the first well in the read transistor region of the semiconductor substrate, a first insulating film pattern formed over the first well in the tunneling region of the semiconductor substrate, a second insulating film pattern formed over the second well in the tunneling region of the semiconductor substrate, a floating gate formed over and contacting the isolation layers and overlapping the tunneling region and the read transistor region, a dielectric film formed over a portion of the floating gate that overlaps the tunneling region, and a control gate formed over the dielectric film.

In accordance with embodiments, a method of fabricating a semiconductor memory device may include at least one of the following: forming an isolation layer on and/or over a semiconductor substrate to define a tunneling region and a read transistor region, and then forming a first well in the tunneling region and a second well in the read transistor region, and then forming a gate oxide film in an area between sections of the isolation layer formed in the tunneling region and in an area between sections of the isolation layer formed in the read transistor region, and then forming a floating gate poly on and/or over the semiconductor substrate including the gate oxide film in the tunneling region and the read transistor region, and then forming a capacitor dielectric film on and/or over the floating gate poly in the tunneling region, and then forming a control gate poly on and/or over the capacitor dielectric film.

In accordance with embodiments, a method may include at least one of the following: forming a plurality of isolation layers in a semiconductor substrate to define a tunneling region and a read transistor region, and then forming a first well in the tunneling region of the semiconductor substrate, and then forming a second well spaced apart from the first well in the read transistor region of the semiconductor substrate, and then forming a first insulating film pattern over the first well in the tunneling region of the semiconductor substrate and a second insulating film pattern over the second well in the tunneling region of the semiconductor substrate, and then forming a floating gate over and contacting the isolation layers and overlapping the tunneling region and the read transistor region, and then forming a dielectric film over a portion of the floating gate that overlaps the tunneling region, and then forming a control gate formed over the dielectric film.

In accordance with embodiments, a method of fabricating a semiconductor memory device may include at least one of the following: forming an isolation layer on and/or over a semiconductor substrate to define a tunneling region and a read transistor region, and then forming a first polysilicon film for floating on and/or over the semiconductor substrate in the tunneling region and the read transistor region, and then forming a dielectric film for charging on and/or over the first polysilicon film in the tunneling region, and then forming a second polysilicon film for control on and/or over the dielectric film.

In accordance with embodiments, a method may include at least one of the following:

DRAWINGS

FIGS. 1 and 2 illustrate single poly EEPROM cell.

Figure 3:
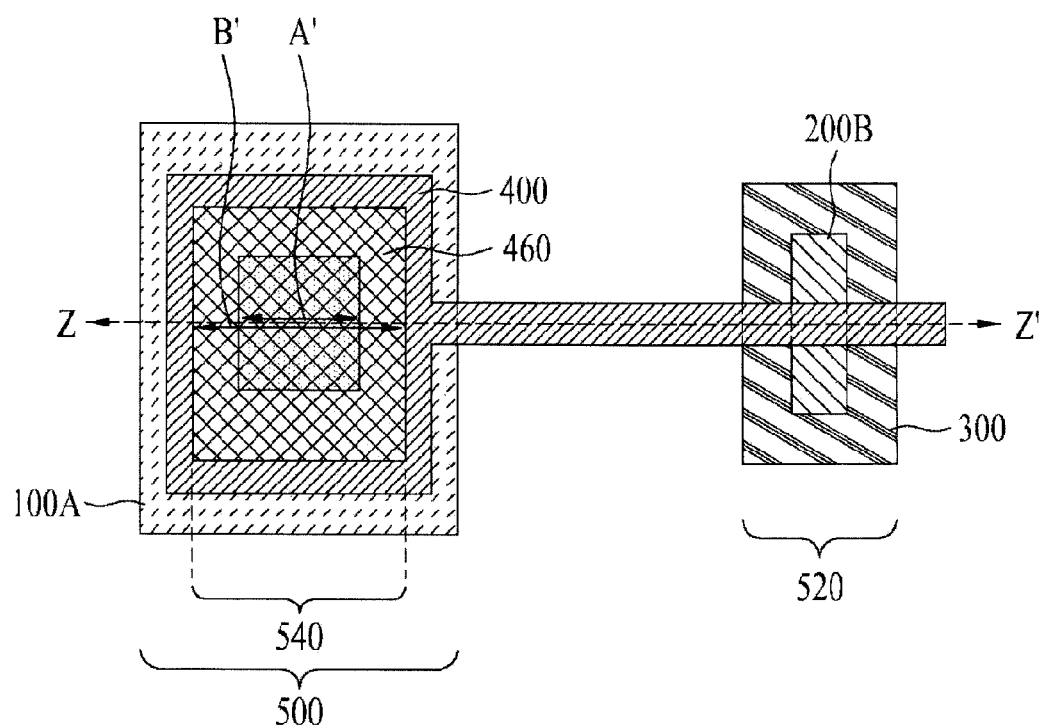

Example FIGS. 3 and 4 illustrate an EEPROM cell and a method of fabricating an EEPROM cell in accordance with embodiments.

DESCRIPTION

Figure 4A:
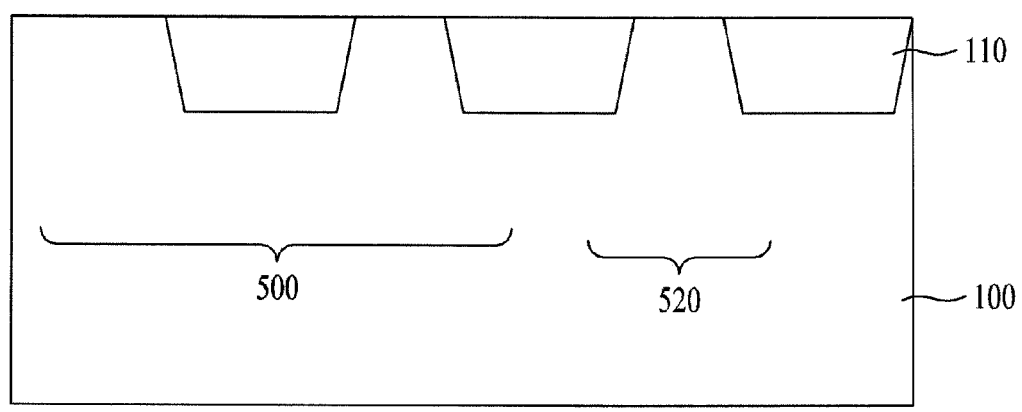
Figure 4B:
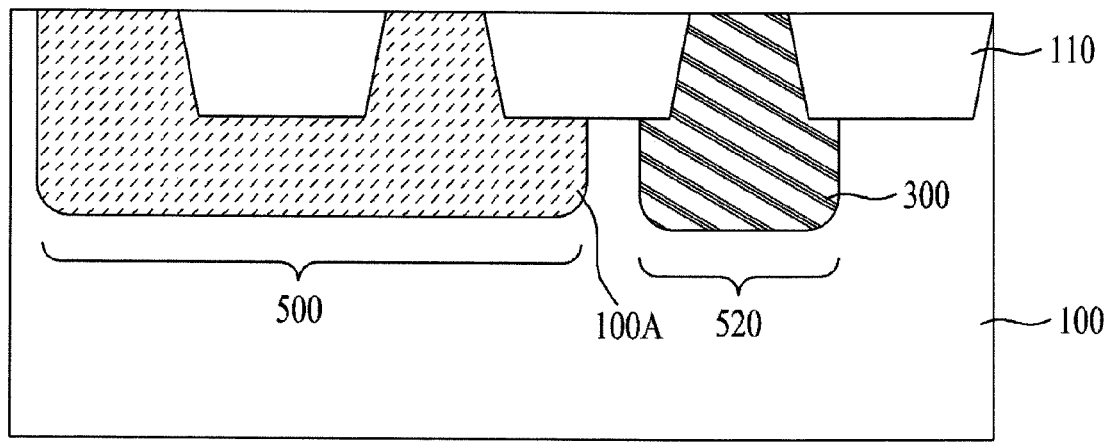
Figure 4C:
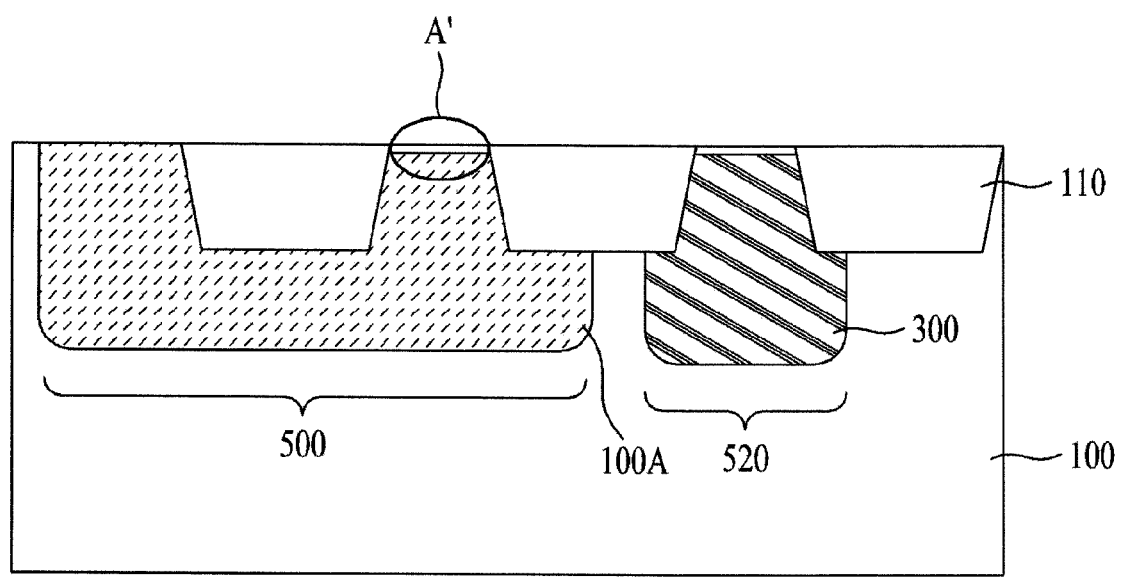
Figure 4D:
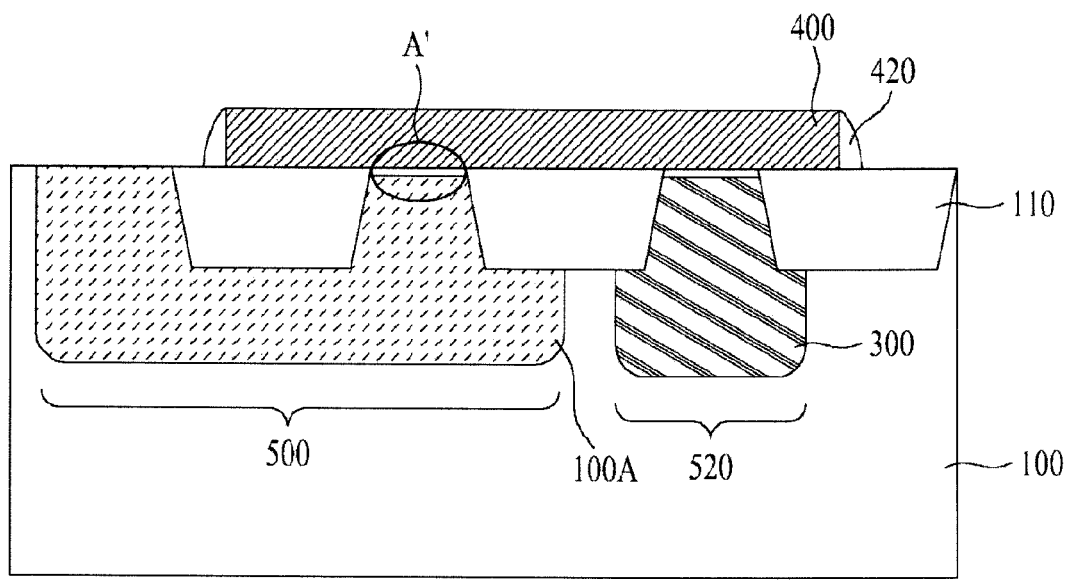
Figure 4E:
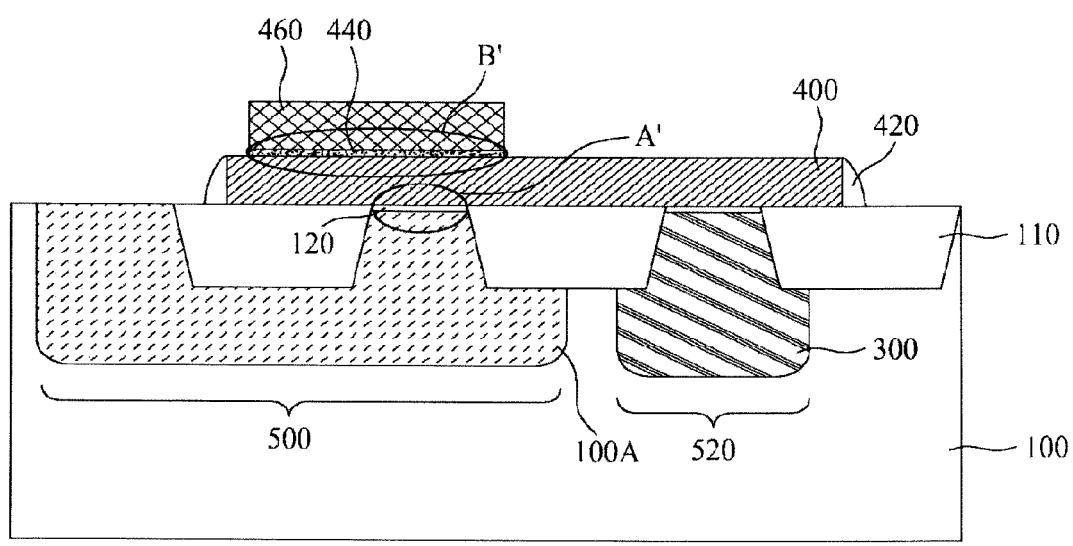
Figure 4F:
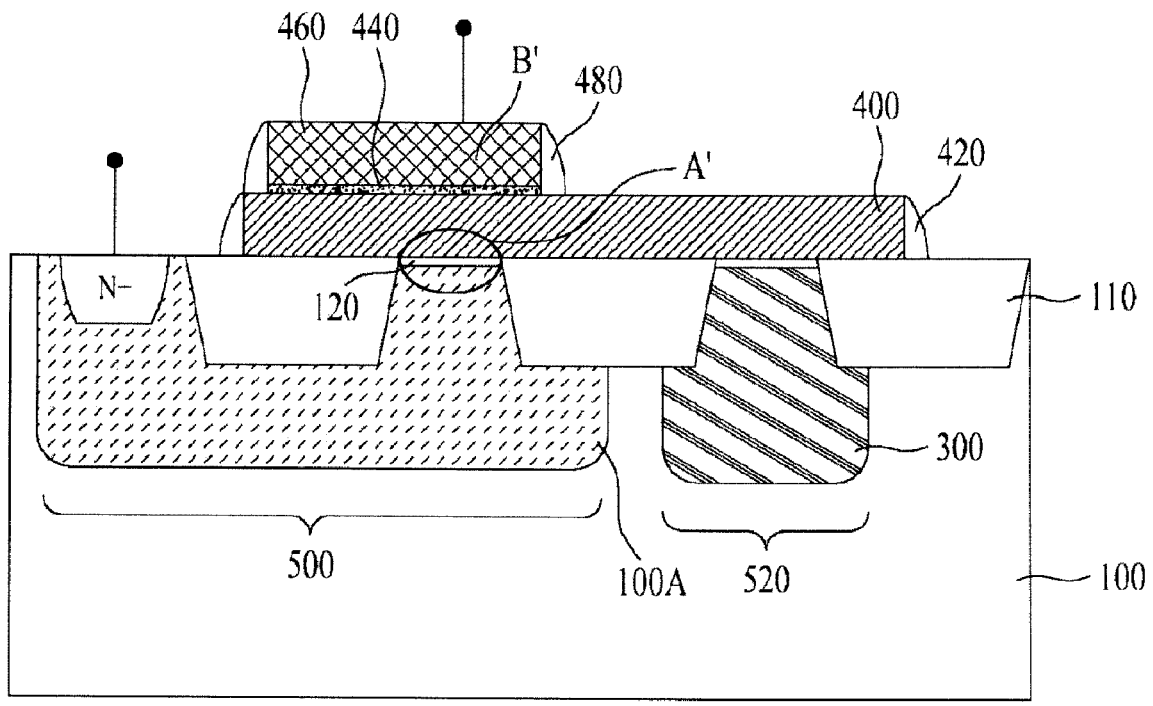

Example FIG. 3 illustrate a plan view of an EEPROM cell while example FIGS. 4A to 4F illustrate longitudinal-sectional views of a method of fabricating the EEPROM cell in accordance with embodiments. Notably, example FIG. 4F illustrate a longitudinal-sectional view taken along the line Z-Z' of the EEPROM cell of example FIG. 3.

As illustrated in example FIG. 3 an EEPROM cell may be divided into tunneling region 500, read transistor region 520 and control gate region 540. Control gate region 540A may include gate poly having a polysilicon-insulator-polysilicon (PIP) structure that is formed on and/or over to overlap tunneling region 500. Read transistor region 520 includes active region 200B and well 300. In tunneling region 500 and control gate region 540, which overlap with each other, active region A' of tunneling region 500 is defined while no active region of control gate region 540 is defined. Since tunneling region 500 and control gate region 540 overlap with each other, no well of control gate region 540 is required, and thus, tunneling region 500 includes well 100A. Well 100A of tunneling region 500 overlapping control gate region 540 may be an N-type well formed by N-type ion implantation, and well 300 of read transistor region 520 may be a P-type well formed by P-type ion implantation. Tunneling of electrons in tunneling region 500 is generated using a coupling ratio between capacitance A' of tunneling region 500 and capacitance B' of control gate region 540, thereby performing programming/erasing operations.

As illustrated in example FIGS. 4A to 4F, the EEPROM cell in accordance with embodiments includes semiconductor substrate 100, a plurality of isolation layers 110 formed in semiconductor substrate 100, lower polysilicon film 400, capacitor dielectric film 440, and upper polysilicon film 460 to form the PIP structure. Semiconductor substrate 100 may be a P-type substrate. Isolation layers 110 may be formed in semiconductor substrate 100 to define tunneling region 500 and read transistor region 520. Lower polysilicon film 400 of the PIP structure may be formed on and/or over and overlap tunneling region 500 and read transistor region 520. Lower polysilicon film 400 may be formed as a floating gate poly which functions as a floating gate.

Thereafter, capacitor dielectric film 440 serving as a capacitor for charging is formed on and/or over lower polysilicon film 400. Upper polysilicon film 460 is formed on and/or over capacitor dielectric film 440 and may be a control gate poly functioning as a control gate. FN tunneling is generated at an area where lower polysilicon film 400 and active region A' of tunneling region 500 overlap with each other.

As illustrated in example FIG. 4A, isolation layers 110 are formed in formed semiconductor substrate 100 to define tunneling region 500 and read transistor region 520. Isolation layers 110 may be formed through a local oxidation of silicon (LOCOS) process or a shallow trench isolation (STI) process.

As illustrated in example FIG. 4B, first well 100A is formed in semiconductor substrate 100 at tunneling region 500 and second well 300 is formed in semiconductor substrate 100 at read transistor region 520 through ion implantation. First well 100A may be formed spaced apart from second well 300. First well 100A may be an N-type well formed by implanting N-type ions into tunneling region 500 of semiconductor substrate 100. Second well 300 may be a P-type well 300 formed by implanting P-type ions into read transistor region 520 of semiconductor substrate 100.

As illustrated in example FIG. 4C, gate oxide film 120 is formed on and/or over semiconductor substrate 100 in respective active regions A' and 200B of tunneling region 500 and read transistor region 520. Meaning, a gate oxide film 120 is formed in an area between adjacent or otherwise neighboring isolation layers 110 in tunneling region 500 and an area between adjacent or otherwise neighboring isolation layers 110 in read transistor region 520.

As illustrated in example FIG. 4D, lower polysilicon film 400 which may function as a floating gate poly is formed on and/or over the entire surface of semiconductor substrate 100 including gate oxide film 120 and partially on and/or over isolation layers 110 at tunneling region 500 and read transistor region 520. First sidewall spacers 420 may be formed at both sides of lower polysilicon film 400.

As illustrated in example FIG. 4E, capacitor dielectric film 440 for charging is formed on and/or over lower polysilicon film 400. Particularly, capacitor dielectric film 440 is formed on and/or over a portion of the uppermost surface of lower polysilicon film 400 formed at tunneling region 500 but not at read transistor region 520. Capacitor dielectric film 440 may have a single layer structure such as an oxide film or nitride film. Alternatively, capacitor dielectric film 440 may have a multi-layer structure including an oxide-nitride-oxide (ONO) film by depositing a first oxide film, a nitride film and a second oxide film in tunneling region 500 of semiconductor substrate 100. Upper polysilicon film 460 functioning as a control gate poly may then be formed on and/or over capacitor dielectric film 440. Particularly, upper polysilicon film 460 is formed on and/or over a portion of capacitor dielectric film 440 formed in tunneling region 500 but not in read transistor region 520.

A process of forming capacitor dielectric film 440 and upper polysilicon film 460 will be described in detail, as follows. First, a dielectric material, such as an oxide and/or a nitride, is deposited on and/or over the uppermost surface of lower polysilicon film 400 or the entire surface of semiconductor substrate 100 including lower polysilicon film 400. As an example of the formation of capacitor dielectric film 440 using an ONO film, a first oxide film is grown using a first thermal oxidation process, a nitride film is deposited on and/or over the first oxide film using low pressure chemical vapor deposition (LPCVD), and a second oxide film is grown on and/or over the nitride film using a second thermal oxidation process. As another example of the formation of capacitor dielectric film 440 using an ONO film, a first oxide film, a nitride film, and a second oxide film are respectively formed by LPCVD, first annealing is carried out after the LPCVD process for the formation of the first oxide film to achieve densification of the first oxide film, and second annealing is carried out after the LPCVD process for the formation of the second oxide film to achieve densification of the second oxide film.

Thereafter, polysilicon for upper polysilicon film 460 is deposited on and/or over the dielectric material of capacitor dielectric film 440. A mask pattern is then formed on and/or over the polysilicon in a region corresponding to tunneling region 500. The polysilicon and the dielectric material are then patterned through an etching process using the mask pattern, thus forming capacitor dielectric film 440 and upper polysilicon film 460.

Moreover, in the formation of capacitor dielectric film 400 using the ONO film, in addition to the above process in which capacitor dielectric film 400 and upper polysilicon film 460 arc etched simultaneously, the following process may be applied. Capacitor dielectric film 440 may be formed by depositing a first oxide film in tunneling region 500 of semiconductor substrate 100, then depositing a nitride film on and/or over the first oxide film, and then depositing a second oxide film on and/or over the nitride film. Upper polysilicon film 460 is then formed on and/or over the capacitor dielectric film 440 by deposition and etching.

As illustrated in example FIG. 4F, second sidewall spacers 480 may be formed at both sides of both capacitor dielectric film 440 and upper polysilicon film 460.

As described above, in a semiconductor memory device in accordance with embodiments, the cell density of an EEPROM is increased only by addition of a PIP process. Accordingly, it is not necessary to increase the cell size of the EEPROM to enhance cell density.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor memory device comprising:
a semiconductor substrate;
an isolation layer formed in the semiconductor substrate to define a tunneling region and a read transistor region, wherein a part of an active region of the tunneling region is exposed beside the isolation layer;
a lower polysilicon film formed on and overlapped with the tunneling region and the read transistor region;
a dielectric film formed on a portion of the lower polysilicon film that overlaps the tunneling region; and
an upper polysilicon film formed on the dielectric film,
wherein both the upper polysilicon film and the lower polysilicon film overlap with the part of the active region of the tunneling region.

2. The semiconductor memory device of claim 1, further comprising:
an N-type well formed in the tunneling region of the semiconductor substrate; and
a P-type well formed in the read transistor region of the semiconductor substrate and spaced apart from the N-type well.

3. The semiconductor memory device of claim 1, wherein the lower polysilicon film comprises a floating gate.

4. The semiconductor memory device of claim 1, wherein the dielectric film comprises as a capacitor.

5. The semiconductor memory device of claim 1, wherein the upper polysilicon film comprises a control gate.

6. A semiconductor memory device comprising:
a semiconductor substrate;
a plurality of isolation layers formed in the semiconductor substrate defining a tunneling region and a read transistor region, wherein a part of an active region of the tunneling region is exposed beside the isolation layers;
a first well formed in the tunneling region of the semiconductor substrate;
a second well formed in the read transistor region and spaced apart from the first well;
a first insulating film pattern formed on the first well in the tunneling region of the semiconductor substrate;
a second insulating film pattern formed on the second well in the read transistor region of the semiconductor substrate;
a floating gate formed on and contacting the isolation layers and overlapping the tunneling region and the read transistor region;
a dielectric film formed on a portion of the floating gate that overlaps the tunneling region; and
a control gate formed on the dielectric film,
wherein both the control gate and the floating gate overlap with the part of the active region of the tunneling region.

7. The semiconductor memory device of claim 6, wherein the first well comprises an N-type well and the second well comprises a P-type well.

8. The semiconductor memory device of claim 6, wherein the first insulating film pattern and the second insulating film pattern are respectively formed in a space between neighboring isolation patterns.

9. The semiconductor memory device of claim 6, further comprising:
first spacers formed on sidewalls of the floating gate; and
second spacers formed on sidewalls of the control gate and the dielectric film.

10. A method of fabricating a semiconductor memory device comprising:
forming a plurality of isolation layers in a semiconductor substrate to define a tunneling region and a read transistor region, wherein a part of an active region of the tunneling region is exposed beside the isolation layers;
forming a first well in the tunneling region of the semiconductor substrate;
forming a second well in the read transistor region of the semiconductor substrate, wherein the second well is spaced apart from the first well;
forming a first insulating film pattern on the first well in the tunneling region of the semiconductor substrate and a second insulating film pattern on the second well in the tunneling region of the semiconductor substrate;

forming a floating gate on and contacting the isolation layers and overlapping the tunneling region and the read transistor region;

forming a dielectric film on a portion of the floating gate that overlaps the tunneling region;

forming a control gate formed on the dielectric film, wherein both the control gate and the floating gate overlap with the part of the active region of the tunneling region.

11. The method of claim 10, wherein the first well is formed by implanting N-type ions into the tunneling region.

12. The method of claim 10, wherein the second well is formed by implanting P-type ions into the read transistor region.

13. The method of claim 10, wherein forming the dielectric film comprises depositing an oxide film over the floating gate.

14. The method of claim 10, wherein forming the dielectric film comprises:

depositing a first oxide film over the floating gate in the tunneling region of the semiconductor substrate; and then depositing a nitride film over the first oxide film; and then depositing a second oxide film over the nitride film; and then patterning the first oxide film, the nitride film and the second oxide film.

15. The method of claim 10, wherein the dielectric film and the control gate are formed simultaneously.

16. The method of claim 10, further comprising, after forming the floating gate and before forming the dielectric film:

forming first spacers formed on sidewalls of the floating gate.

17. The method of claim 16, further comprising, after forming the control gate:

forming second spacers formed on sidewalls of the control gate and the dielectric layer.

18. The method of claim 10, wherein the isolation layers are formed through a local oxidation of silicon (LOCOS) process.

19. The method of claim 10, wherein the isolation layers are formed through a shallow trench isolation (STI) process.

* * * * *